United States Patent [19]
Murakami et al.

[11] Patent Number: 5,587,609
[45] Date of Patent: Dec. 24, 1996

[54] II-VI GROUP COMPOUND SEMICONDUCTOR DEVICE METALLIC NITRIDE OHMIC CONTACT FOR P-TYPE

[75] Inventors: Masanori Murakami, Tsuzuki-gun; Yasuo Koide, Kyoto; Nobuaki Teraguchi; Yoshitaka Tomomura, both of Nara, all of Japan

[73] Assignee: Sharp Kabushiki Kaisha, Osaka, Japan

[21] Appl. No.: 409,307

[22] Filed: Mar. 23, 1995

[30] Foreign Application Priority Data

Mar. 24, 1994 [JP] Japan ................................ 6-053588

[51] Int. Cl.[6] ........................ H01L 29/45; H01L 29/43; H01L 23/48
[52] U.S. Cl. ..................... 257/744; 257/78; 257/99; 257/741; 257/761; 257/762; 257/763; 257/766; 257/769; 257/770
[58] Field of Search ................................ 257/12, 13, 22, 257/78, 94, 99, 103, 200, 201, 741, 743, 744, 749, 751, 761, 762, 763, 764, 765, 766, 767, 768, 769, 770

[56] References Cited

FOREIGN PATENT DOCUMENTS 5-259509  10/1993  Japan .

OTHER PUBLICATIONS

Jeon, H., et al. "Blue-green injection laser diodes in (Zn, Cd)Se/ZnSe quantum wells," Appl. Phys. Lett. (1991) 59(27):3619-21.

Ohtsuka, T., et al. "Growth and Characterization of p-type CdSe," Preliminary Drafts of Lecture (1993) vol. 1, (presented at the 54th Conference on Applied Physics, Scientific Lecture Meeting) (English translation attached).

Haase, M. A., et al. "Blue-green laser diodes," Appl. Phys. Lett. (1991) 59(11):1272-74.

Haase, M. et al. "Short wavelength II-VI laser diodes," Inst. Phys. Conf. Ser. (1991) No. 120: Chap. 1, pp. 9-16 (paper presented at Int. Symp. GaAs and Related Compounds, Seattle).

Lansari, Y., et al. "Improved ohmic contacts for p-type ZnSe and related p-on-n diode structures," Appl. Phys. Lett. (1992) 61(21):2554-56.

Hiei, F., et al. "Ohmic contacts to p-type ZnSe using ZnTe/ZnSe multiquantum wells," Electronic Letters (1993) 29(10):878-79.

Fan, Y., et al. "Graded band gap ohmic contact to p-ZnSe," Appl. Phys. Lett. (1992) 61(26):3160-62.

Primary Examiner—Mahshid Saadat
Assistant Examiner—Alice W. Tang
Attorney, Agent, or Firm—Morrison & Foerster LLP

[57] ABSTRACT

A II-VI group compound semiconductor device having a p-type $Zn_xMg_{1-x}S_ySe_{1-y}$ ($0 \leq x \leq 1$, $0 \leq y \leq 1$) semiconductor layer, on which an electrode layer is formed with at least metallic nitride layer lying between the semiconductor layer and the electrode layer.

6 Claims, 10 Drawing Sheets

II-VI GROUP COMPOUND SEMICONDUCTOR DEVICE METALLIC NITRIDE OHMIC CONTACT FOR P-TYPE

BACKGROUND OF THE INVENTION

1. Field of the Invention

The present invention relates to a II-VI group compound semiconductor device and a method for manufacturing the same. More particularly it relates to a II-VI group compound semiconductor device having an electrode structure with small contact resistance, especially an electrode structure which enables an ohmic contact, and a method for manufacturing the same.

2. Description of the Prior Arts

So far various types of electrodes for a II-VI group compound semiconductor device have been studied. Haase et al., for example, have examined the applicability of Li, Na, Mg, Ti, Cr, Mn, Ni, Pd, Pt, Cu, Ag, Zn, Hg, Al, In, Sn, Pb, Sb or Bi and alloys thereof as electrode materials ("Short wavelength II-VI laser diodes", Inst. Phys. Conf. Ser. No.120 p.9). However electrode materials which provide ohmic contacts for II-VI group compound semiconductors have not yet been found.

Thus, Au is extensively used as an electrode metal, but since Au forms a Schottky junction with approximately 1.2 eV of potential barrier to p-type ZnSe, ohmic contacts have not yet been made.

In order to make the ohmic contact to, for example, p-type ZnSe, following methods are considered:

a low-energy-barrier intermediate layer of CdSe or HgSe is epitaxially grown between the electrode metal and p-type ZnSe, or p-type ZnTe is used for the contact layer and a p-type ZnSeTe graded composition layer or an intermediate layer of a p-type ZnSe/ZnTe strained-layer superlattice is used between the p-type ZnSe and p-type ZnTe.

Otsuka et al. have demonstrated an ohmic contact of Au/p-CdSe and reported the possibility of that of Au/p-CdSe/p-ZnSe ("Growth and Characterization of p-type CdSe", Otsuka et al., Extended Abstracts (the 54th) p.255, The Japan Society of Applied Physics). Lansari et al. have made a good ohmic contact by growing HgSe on p-type ZnSe as a low-energy barrier intermediate layer by MBE and using Au as an electrode metal ("Improved ohmic contact for p-type ZnSe and related p-on-n diode", Y. Lansari et al., Appl. Phys. Lett. 61 p.2554). Fan et al. ("Graded bandgap ohmic contact to p-ZnSe", Y. Fan et al., Appl. Phys. Lett. 61 p.3160), and Hiei et al. ("Ohmic contact to p-type ZnSe using ZnTe/ZnSe multiquantum wells", F. Hiei et al., Electronics Lett. 29 P.878) have reported the fabrication of an ohmic contact by using p-type ZnTe for the contact layer and using a p-type ZnSeTe graded composition layer or the intermediate layer of a p-type ZnSe/ZnTe strained layer superlattice between the p-type ZnSe and p-type ZnTe.

However, none of the methods of making ohmic contacts to the conventional II-VI group compound semiconductors are satisfactory. They have the problems below.

When CdSe is used, a low CdSe acceptor concentration of $1 \times 10^{17}$ cm$^{-3}$ in CdSe makes it difficult to lower contact resistance. When HgSe is used, the sharing of the MBE apparatus used for forming other layers in the device manufacturing process brings deteriorated properties of devices because of the mixing of Hg atoms into other layers. Introducing exclusive MBE apparatus to avoid intermixing of atoms will conduct lower productivity. Furthermore, HgSe has poor chemical and physical stability.

When ZnTe is used, the stress remaining in the film because of large lattice mismatch between ZnSe and ZnTe may deteriorate the properties of devices, and it is difficult to keep ZnTe carrier concentration suitable. A large lattice mismatch between ZnSe and any of the above intermediate layers also causes strain, and the epitaxial growth lowers the productivity.

Furthermore, the Au electrodes used for the above methods are inferior in mechanical strength such as adhesion.

Accordingly, research was continued to create an electrode structure which makes an ohmic contact to II-VI group compound semiconductors, especially to p-type $Zn_xMg_{1-x}S_ySe_{1-y}$ ($0 \leq x \leq 1$, $0 \leq y \leq 1$) semiconductors.

FIG. 9 shows an ionized impurity concentration dependence of contact resistance of a metal/p-ZnSe Schottky junction as a parameter of the potential barrier $\phi_B$ between the metal and p-type ZnSe. As shown in FIG. 10, the potential barrier $\phi_B$ is given by $\phi_B = x_s + E_g - \phi_M$, in which $x_s$ represents an electron affinity of semiconductor, $E_g$ represents a bandgap of semiconductor and $\phi_M$ represents a work function of metal. FIG. 8 is a band diagram illustrating the Schottky barrier at a contact interface when a p$^+$-ZnSe layer lies between the metal and p-type ZnSe. FIG. 9 shows what is obtained by a calculation using the Yu model in which thermionic emission and tunneling currents are considered ("Electron Tunneling and Contact Resistance of Metal-Si Contact Barrier", A. Y. C. Yu, Solid State Electronics vol.13 p.239 (1970)). As a result, the contact resistance decreases with the increase of the ionized impurity concentration. This is due to the decrease of Schottky barrier width (w), as shown in FIG. 8, with increasing ionized impurity concentration, which results in the rapid increase of tunneling current.

This is also the same between metal and p-type $Zn_xMg_{1-x}S_ySe_{1-y}$ ($0 \leq x \leq 1$, $0 \leq y \leq 1$) semiconductors. For example, a figure showing the dependence of contact resistance on impurity concentration (i.e., corresponding to FIG. 9) shows a similar inclination in which the contact resistance differs in one figure against the same potential barrier parameter.

In other words, an ohmic contact can be made by using a intermediate layer having a high ionized impurity concentration on the p-type $Zn_xMg_{1-x}S_ySe_{1-y}$ ($0 \leq x \leq 1$, $0 \leq y \leq 1$) semiconductor layer surface, on which metal electrodes are formed.

However, p-type $Zn_xMg_{1-x}S_ySe_{1-y}$ ($0 \leq x \leq 1$, $0 \leq y \leq 1$) semiconductor film is formed only by MBE, and the ionized impurity concentration is, at best in the order of $10^{17}$ cm$^{-3}$. It is impossible to form a film with sufficiently high ionized impurity concentration to make an ohmic contact.

SUMMARY OF THE INVENTION

The present invention provides a II-VI group compound semiconductor device comprising a p-type $Zn_xMg_{1-x}S_ySe_{1-y}$ ($0 \leq x \leq 1$, $0 \leq y \leq 1$) semiconductor layer, and an electrode layer formed on the semiconductor layer through at least metallic nitride layer between the semiconductor layer and electrode layer.

Further the present invention provides a method for manufacturing a II-VI group compound semiconductor device having a p-type $Zn_xMg_{1-x}S_ySe_{1-y}$ ($0 \leq x \leq 1$, $0 \leq y \leq 1$) semiconductor layer which comprises forming the semiconductor layer on a substrate, doping nitrogen during or after the growth of the semiconductor layer, forming an electrode on the resulting semiconductor layer by depositing a metal with free energy change ΔG of nitride formation lower than −100 KJ/mol or its intermetallic compound, optionally followed by an annealing.

An object of the present invention is to provide a II–VI group compound semiconductor device and a method for manufacturing the same wherein small contact resistance electrodes are available without directly forming a p-type $Zn_xMg_{1-x}S_ySe_{1-y}$ (0≦x≦1, 0≦y≦1) semiconductor layer having a high ionized impurity concentration.

$$\phi_B = x_s + E_g - \phi_M.$$

Figure 11:
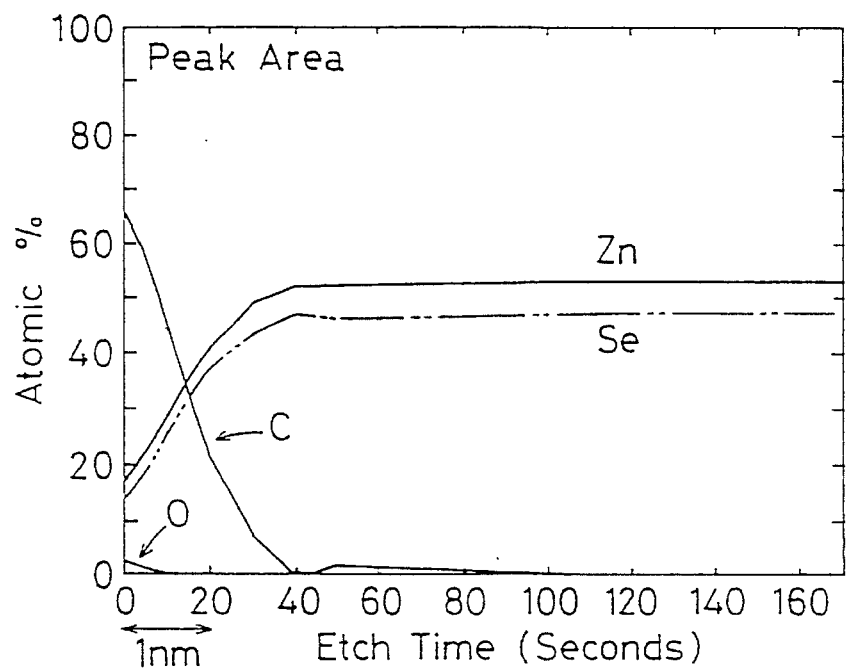

FIG. 11 is an AES in-depth profile taken from an undoped ZnSe epitaxial layer cleaned by acetone solution.

Figure 12:
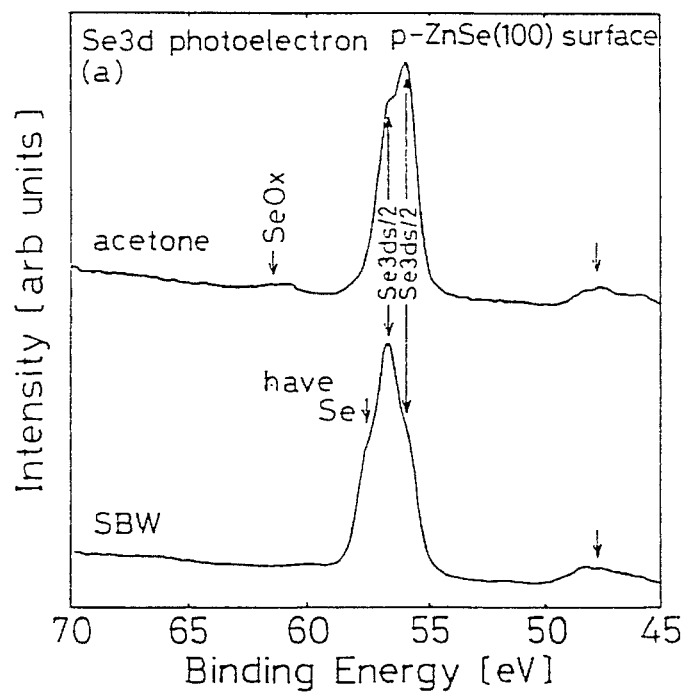

FIG. 12 is an X-ray photoemission spectra of Se 3d electrons for ZnSe epitaxial layers cleaned by acetone and etched by SBW.

DETAILED DESCRIPTION OF THE PREFERRED EMBODIMENTS

Figure 7:
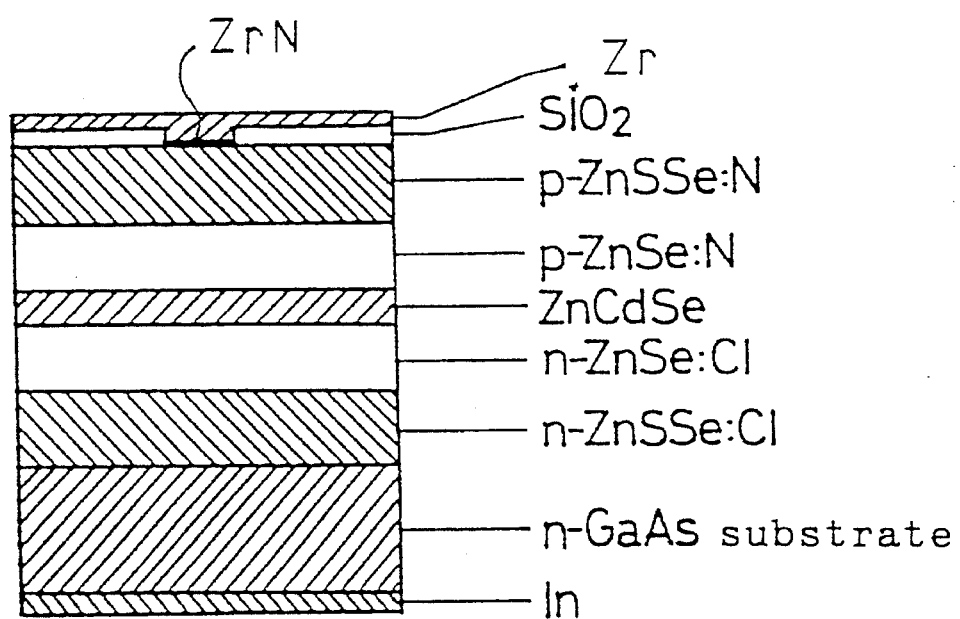
FIG. 7 is a schematic sectional view showing a II-VI group compound semiconductor device of the present invention.

The semiconductor device of the present invention may include a light-emitting diode or a semiconductor laser as shown in FIG. 7. Basically, a p-type $Zn_xMg_{1-x}S_ySe_{1-y}$ (0≦x≦1, 0≦y≦1) semiconductor layer is formed on a substrate and an electrode through at least a metallic nitride layer is formed on the semiconductor layer.

Example of the substrates are compound semiconductor substrates known in the art, typically GaAs substrate.

Example of the p-type $Zn_xMg_{1-x}S_ySe_{1-y}$ (0≦x≦1, 0≦y≦1) semiconductor layers in the present invention includes ZnS (x=1, y=1), MgS (x=0, y=1), ZnSe (x=1, y=0), MgSe (x=0, y=0), $ZnS_ySe_{1-y}$ (x=1, 0<y<1), $MgS_ySe_{1-y}$ (x=0, 0<y<1), $Zn_xMg_{1-x}S$ (0<x<1, y=1), $Zn_xMg_{1-x}Se$ (0<x<1, y=0), or $Zn_xMg_{1-x}S_ySe_{1-y}$ (0<x<1, 0<y<1). Preferably, the semiconductor layers are ZnSe (most extensively used for contact layers), $ZnS_{0.07}Se_{0.93}$ (latticed-matched to GaAs) and ZnMgSSe (lattice-matched to GaAs and having not more than 3.0 eV of bandgap energy and not less than $10^{17}$ $cm^{-3}$ of effective acceptor concentration Na-Nd). The thickness of the semiconductor layer is e.g., in the range of 10–10,000 nm without limitation and can be suitably adjusted in accordance with use of the semiconductor device or the like.

The metallic nitride layer intervened between the semiconductor layer and electrode layer is preferably a metallic nitride with more than 800° C. of melting point, such as NbN, VN, WN, TaN, MoN, HfN, ZrN, ScN, TiN, CrN, WTiN or WSiN, or a combination thereof such as NbVN, NbHfN, ScVN and CrTaN. The metallic nitride layer can exert desired effects when it is a mono-atomic layer, but is preferably those having not less than several atomic layers in accordance with the surface roughness of the semiconductor layer. This is because when the metallic nitride layer is too thin it cannot compensate the surface roughness, which may lead undesirable direct contact of the semiconductor layer and the electrode. Thus it is preferable to form the metallic nitride layer so as to sufficiently cover all the surface of the semiconductor layer. The thickness of the metallic nitride layer may be not more than 10 nm thick. When the metallic nitride layer is more than 10 nm thick, it causes strain and crystal defect at the interface between the nitride layer and the semiconductor layer or at the side of the semiconductor layer, or separation of the interface of these two layers due to the difference in lattice constant and thermal expansion coefficient of these two layers, thereby deteriorating the electrode property. Preferably, the metallic nitride layer is thin sufficient to allow free movement of carriers between the semiconductor layer and the electrode or to not substantially disturb the movement of carriers.

In order to form the metallic nitride layer, an advanced technique such as MBE method is unnecessary. It is easily formed as a thin layer by the sputter method in which NbN, VN, WN, TaN, MoN, HfN, ZrN, ScN, TiN, CrN, WTiN or WSiN, or a combination thereof such as NbVN, NbHfN, ScVN and CrTaN is used as a target.

Materials for the electrode layer may be any materials used for electrode in the art, such as Al, Pt, Mn, Cr, Nb, V, Ta, Zr, Mo, Hf, Zr or W. The electrode can be formed by using conventional metal deposition methods such as resistive heating evaporation, electron beam evaporation or sputter method. The thickness of the electrode layer is preferably in the range of 10 to 10,000 nm.

The present invention provides a method for manufacturing a II-VI group compound semiconductor device having a p-type $Zn_xMg_{1-x}S_ySe_{1-y}$ (0≦x≦1, 0≦y≦1) semiconductor layer which comprises forming the semiconductor layer on a substrate, doping nitrogen during or after the growth of the semiconductor layer, forming an electrode on the resulting semiconductor layer by depositing a metal with free energy change ΔG of nitride formation lower than −100 KJ/mol or its intermetallic compound onto the semiconductor layer optionally followed by an annealing.

The semiconductor layer in the present invention can be formed by a known method such as MBE, MOCVD or CVD method.

When the semiconductor layer is being formed e.g., by MBE method, nitrogen is preferably doped by nitrogen radical doping method to the semiconductor layer. Further, nitrogen can be doped by sputter or ion plantation method to the semiconductor layer once formed. The concentration of nitrogen in the semiconductor layer may be not less than $1\times10^{18}$ cm$^{-3}$, preferably not less than $1\times10^{19}$ cm$^{-3}$.

Metals with free energy change $\Delta G$ of nitride formation of lower than $-100$ kJ/mol and intermetallic compounds thereof can be used for the metal layer in the method for manufacturing a II-VI group compound semiconductor device of the present invention. Examples of the metals include Nb, V, Ta, Zr, Mo, Hf, Zr, W, WTi or WSi, or an intermetallic compound thereof.

The metal layer is formed by a conventional metal deposition method such as resistive heating evaporation, electron beam evaporation or sputter method. It is preferable to use electron beam evaporation method, because the metal to be employed has a high melting point. In addition, the electron beam evaporation can increase the reactivity between the metal layer and the semiconductor layer because the metal has a high energy and makes it easy to form the metallic nitride by the reaction of the semiconductor layer with the metal layer even at a relatively low substrate heating temperature from room temperature to approximately 300° C.

It is preferable to form the metal layer on the semiconductor layer after removing native oxides or carbides formed on the surface of the semiconductor layer. This is because the cleaning of the semiconductor layer surface lowers contact resistance more efficiently, thereby providing good ohmic characteristics with reproducibility. Native oxide and carbide can be removed, for example, by chemical etching solution containing a saturated bromine water (SBW) before forming the metal layer. Thus the removal of the oxides and carbides from the semiconductor surface makes it possible to form an electrode structure stably on clean semiconductor surface. When the metal layer is formed immediately after the formation of the semiconductor layer (in situ method), the cleaning step is omittable.

Furthermore, an annealing is preferably applied to the metal layer and semiconductor layer after the metal layer is formed. When the metal layer is formed by electron beam evaporation method, it is possible to decrease the contact resistance and make ohmic contacts. However, annealing in respective of the kind of the metal layer formation method can increase nitride formation by the reaction of metal with nitrogen in the semiconductor layer, decreases the contact resistance more efficiently and makes better ohmic characteristics. Although the metal layer formed by resistive heating evaporation method usually does not show sufficient ohmic characteristics, annealing can provides ohmic characteristics thereto.

The temperature for annealing should be in such that the metal and the doped nitrogen can well react each to other and the property of the semiconductor layer is not substantially deteriorated, typically in the range of 100° C.–300° C. This is because when MBE method is conducted below 300° C. for growing the semiconductor layer, annealing at a temperature above 300° C. tends to change the property of the semiconductor device. The electric furnace annealing or RTA (Rapid Thermal Annealing) is available for the annealing.

In the semiconductor device of the present invention, since a metallic nitride layer is formed on the semiconductor layer, the nitrogen as a constituent element of the metallic nitride layer and the nitrogen in the semiconductor layer act as an acceptor in the semiconductor layer at the interface between the metallic nitride layer and semiconductor layer. As a result, the effective ionized impurity concentration on the interface between the p-type $Zn_xMg_{1-x}S_ySe_{1-y}$ ($0\leq x\leq 1$, $0\leq y\leq 1$) semiconductor layer and metallic nitride layer increases, and the contact resistance on this interface decreases.

The semiconductor device of the present invention is based on the fact that when the semiconductor layer contains nitrogen, the metallic nitride layer formed on the p-type $Zn_xMg_{1-x}S_ySe_{1-y}$ ($0\leq x\leq 1$, $0\leq y\leq 1$) semiconductor layer draws the nitrogen and activates it as an acceptor, and the fact that the nitrogen constituting the metallic nitride layer activates as an acceptor in the semiconductor layer.

Figure 8:
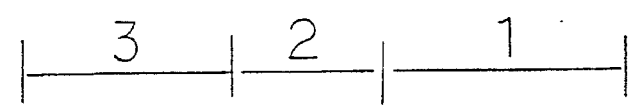
FIG. 8 is a band diagram in which a high ionized impurity concentration p-type $Zn_xMg_{1-x}S_ySe_{1-y}$ (0≦x, y≦1) semiconductor layer is formed at the interface of metal/p-type $Zn_xMg_{1-x}S_ySe_{1-y}$.
Figure 8:
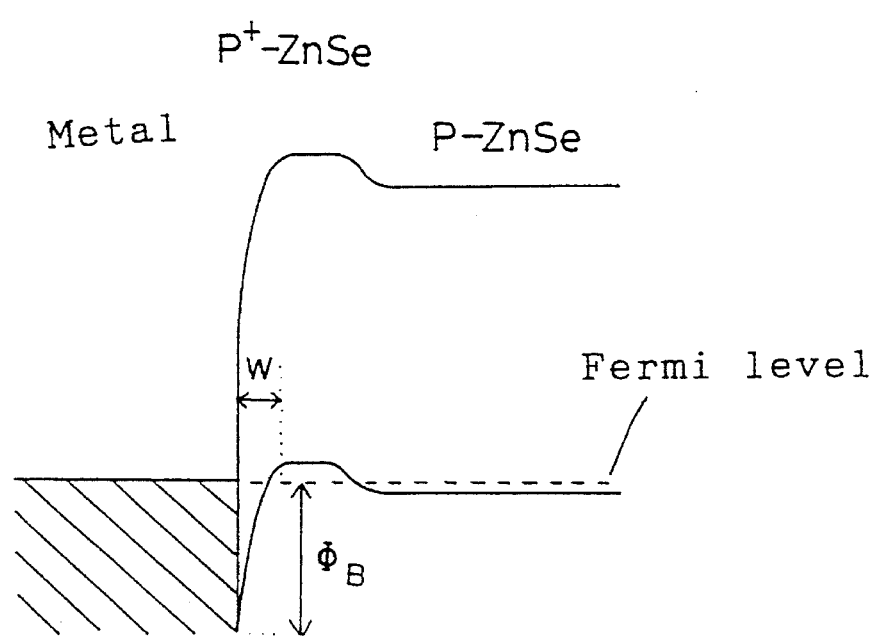

Comparing to the band diagram in FIG. 8, the above metallic nitride layer corresponds to a metal layer region 3, the part with high ionized impurity concentration in the above semiconductor layer corresponds to a p$^+$ region 2, and the above semiconductor layer corresponds to a P region 1.

The metallic nitride is chemically stable, makes bonding firmly with the p-type $Zn_xMg_{1-x}S_ySe_{1-y}$ ($0\leq x\leq 1$, $0\leq y\leq 1$) semiconductor layer, and makes it possible to obtain ohmic characteristics with good mechanical strength. Because of its melting point higher than 800° C. the metallic nitride is thermally stable and provides reliable electrodes without deteriorating owing to the heat caused by current injection.

In accordance with the method for manufacturing the semiconductor device of the present invention, when a metal layer is formed without regard to the forming method, the nitrogen in the p-type $Zn_xMg_{1-x}S_ySe_{1-y}$ ($0\leq x\leq 1$, $0\leq y\leq 1$) semiconductor layer, and the metal with small $\Delta G$ in the metal layer or the intermetallic compound of the metals react on the interface, and form a nitride layer. At this time, the nitrogen in the semiconductor layer is drawn to the interface with the metallic nitride layer, nitrogen concentration increases in the semiconductor layer at the interface, and a p-type $Zn_xMg_{1-x}S_ySe_{1-y}$ ($0\leq x\leq 1$, $0\leq y\leq 1$) semiconductor layer with higher ionized impurity concentration is formed.

The power to draw nitrogen is determined by free energy change $\Delta G$ of nitride formation. Accordingly, the more in minus number the free energy variation $\Delta G$ is, the better it is. Since when it is not less than $-100$ kJ/mol it cannot draw nitrogen atoms well, not more than $-100$ kJ/mol is preferable.

Figure 9:
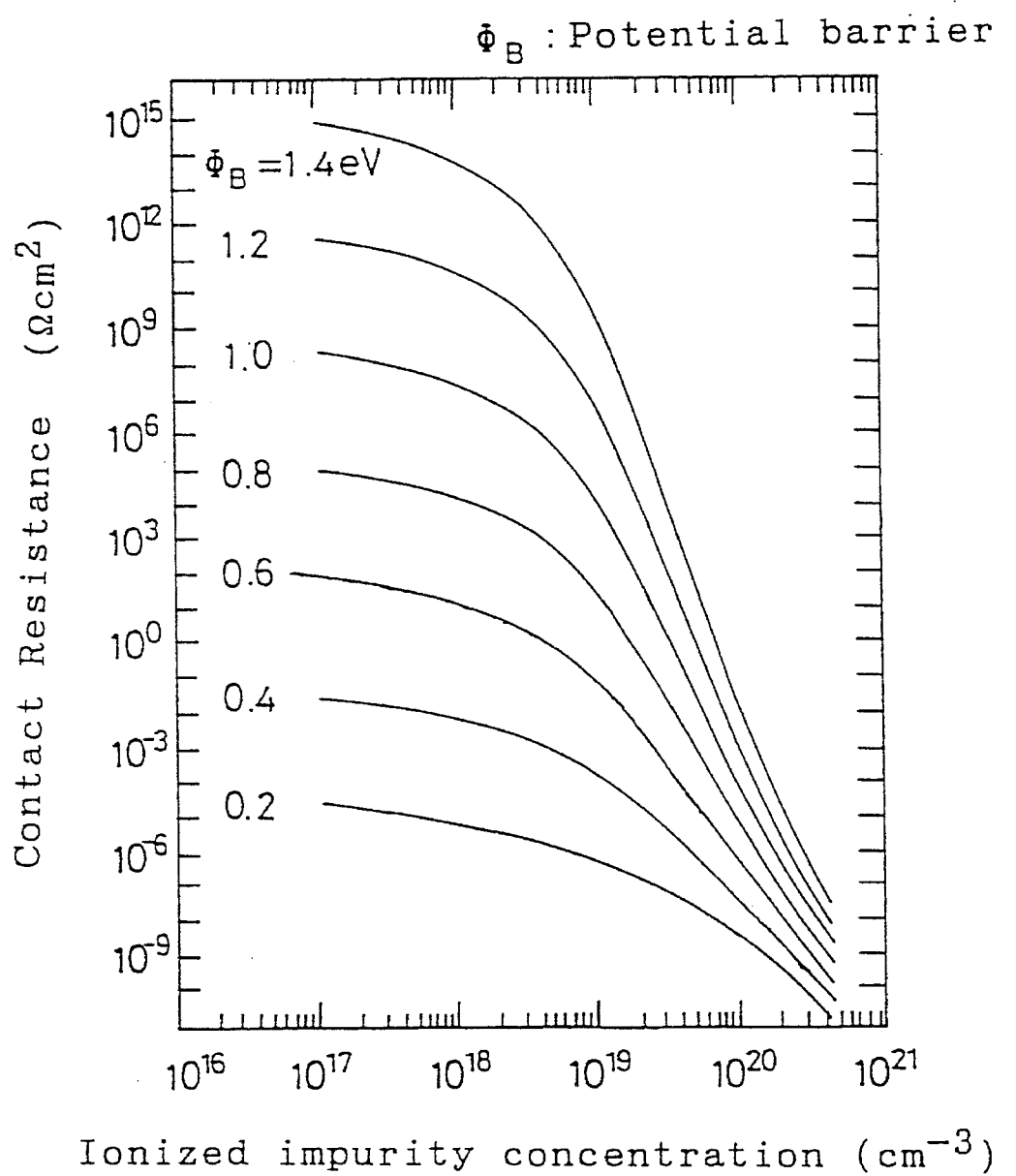
FIG. 9 shows a graph illustrating ionized impurity concentration dependence of contact resistance in a Schottky junction of a p-type ZnSe with a metal theoretically calculated with thermionic emission and tunneling current.
Figure 10:
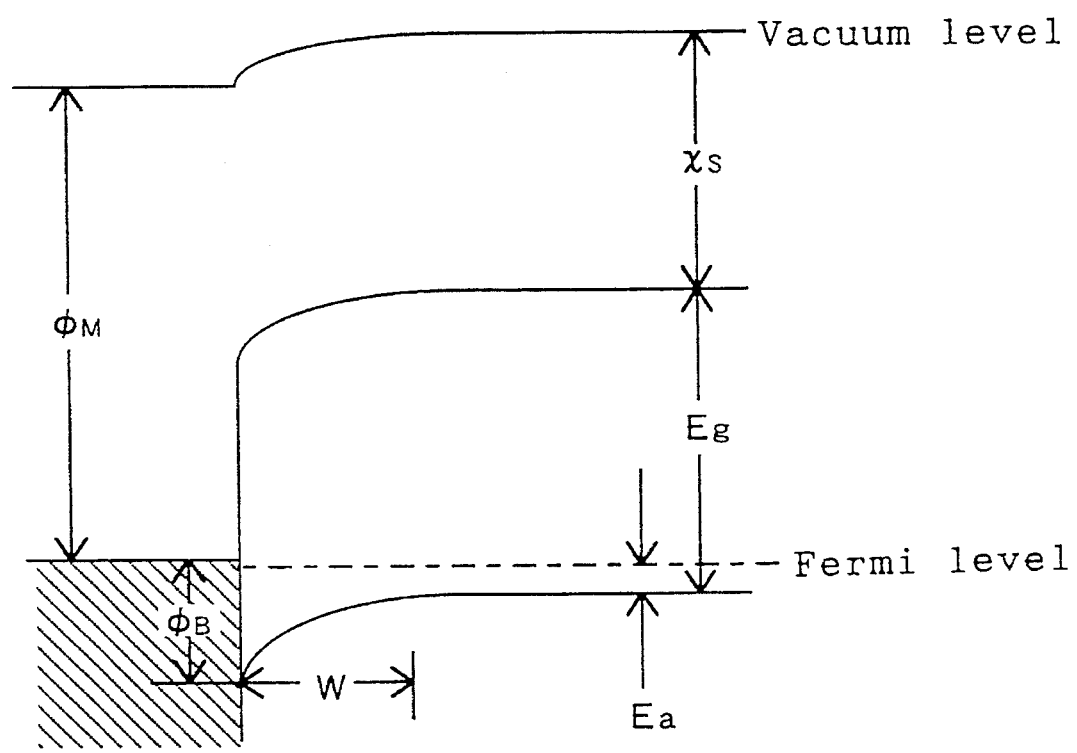
FIG. 10 is a band diagram showing the relationship.

The amount of nitrogen to be doped in the p-type $Zn_xMg_{1-x}S_ySe_{1-y}$ ($0\leq x\leq 1$, $0\leq y\leq 1$) semiconductor layer may be not less than $1\times10^{18}$ cm$^{-3}$, preferably not less than $1\times10^{19}$ cm$^{-3}$. As known by the result shown in FIG. 9, this is because contact resistance decreases steeply at not less than $1\times10^{18}$ cm$^{-3}$, more steeply at not less than $1\times10^{19}$ cm$^{-3}$, and not less than this level of ionized impurity concentration is preferable. In addition, this is because the doped nitrogen is only ionized partially, the rate is tens of percentage order, and mainly non-ionized nitrogen is drawn to the above interface, where ionization increases as well as nitrogen concentration becomes higher than that of the originally doped nitrogen and the ionized impurity concentration obtained at this part is the same as or more than that of the doped nitrogen. When a nitrogen-doped semiconductor layer is used, including the above semiconductor device of the present invention, the amount to be doped may be not less than $1\times10^{18}$ cm$^{-3}$, preferably not less than $1\times10^{19}$ cm$^{-3}$ for the same reason.

Since the metal layer in the present invention contains a metal which forms a compound with nitrogen or an intermetallic compound, the part bonded with the metallic nitride layer has a high adhesion, and enables the formation of stable electrodes. This material has a high melting point of 600° C., and provides electrodes resistant to heat.

EXAMPLE

The semiconductor device and method for manufacturing the same is described below.

Example 1

First, on a semi-insulated GaAs substrate was formed a nitrogen-doped p-type ZnSe layer (Na–Nd=$4\times10^{17}$ cm$^{-3}$ by MBE method with nitrogen radical doping. The surface of the p-type ZnSe layer was cleaned by ultrasonic treatment for 5 minutes in acetone and 2 minutes in ethanol, and was etched for 3 minutes with saturated bromine water (SBW): hydrobromic acid (HBr): water (H$_2$)=1:10:90 at room temperature. By the etching, the p-type ZnSe layer surface was etched approximately 30 nm, and the oxides and carbides on the surface of the p-type ZnSe layer were removed.

Next, an Nb layer was deposited on the p-type ZnSe layer by electron beam evaporation maintaining a substrate temperature at room temperature. The electron beam evaporation was carried out at background pressure in the range of $3\times10^{-7}$–$5\times10^{-7}$ Torr and at not more than $5\times10^{-6}$ Torr of vacuum during the deposition.

The Nb layer was 50 nm thick. Two electrodes with 1 mm diameter of circular planes were formed, and the distance between the centers of the two circles was 2 mm. An electric furnace annealing was carried out for 7 minutes in the atmosphere of nitrogen: hydrogen=95:5.

Figure 3:
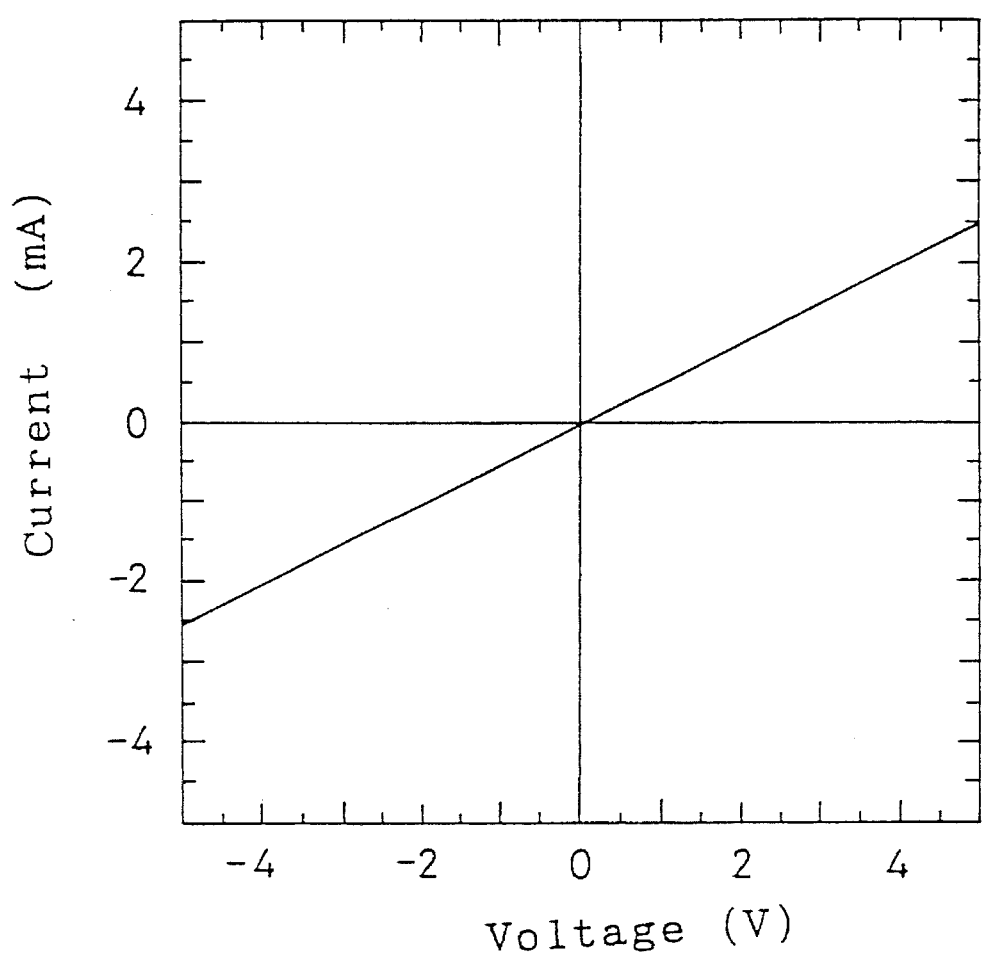
FIG. 3 shows current-voltage characteristics of an Nb/p-ZnSe/p-GaAs structure in an embodiment of a II–VI group compound semiconductor device of the present invention.

Concerning the above-mentioned device having Nb circular electrodes with a distance of 2 mm between the electrode centers, current-voltage characteristics between the two electrodes were measured. FIG. 3 shows the result. As seen in FIG. 3, the electrodes shows good ohmic characteristics.

Figure 4:
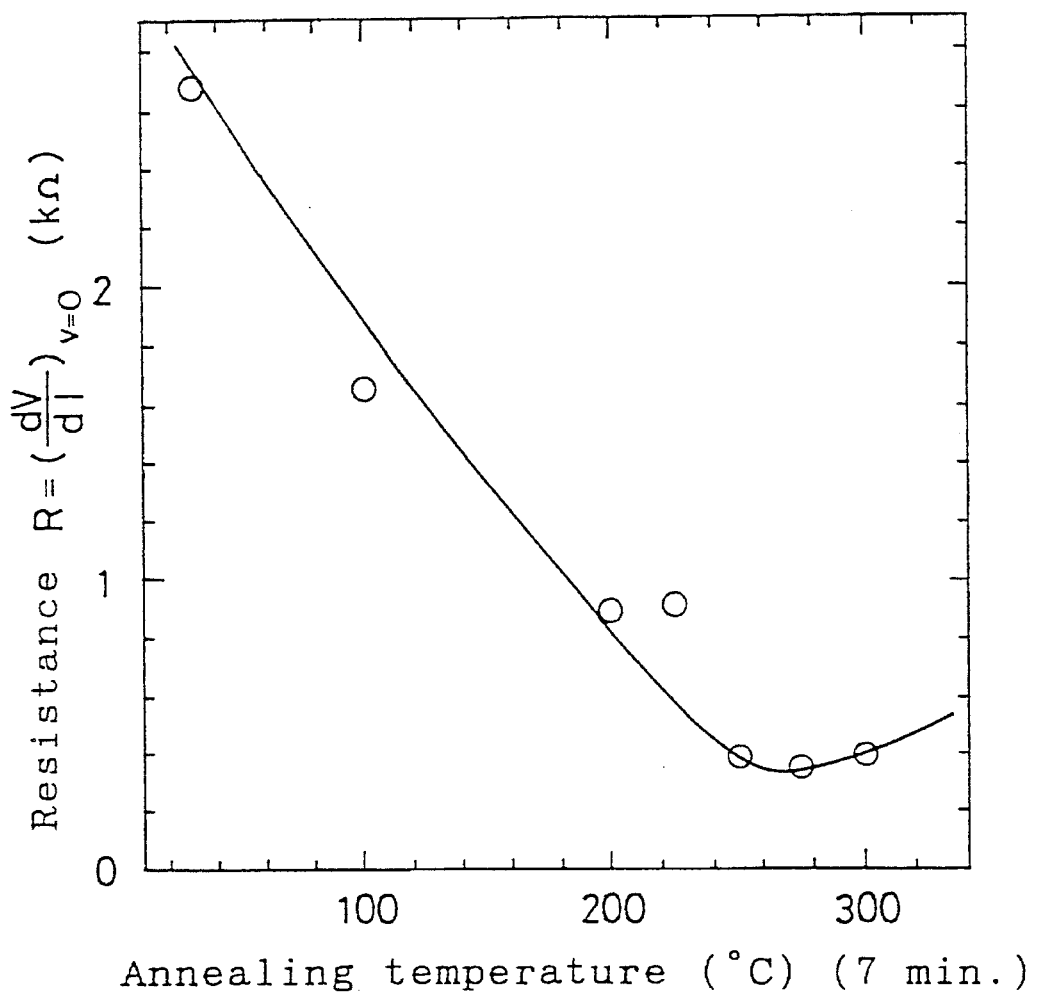
FIG. 4 shows an annealing temperature dependence of differential resistance value at 0 V of an Nb/p-ZnSe/p-GaAs structure of the present invention.

The annealing temperature dependence of the differential resistance value at 0 V of the above sample was measured. FIG. 4 shows the result. As seen in FIG. 4, the resistance value decreased with increasing annealing temperature, reached a minimum at 260° C. and increased gradually at the temperatures higher than 260° C.

Figure 5:
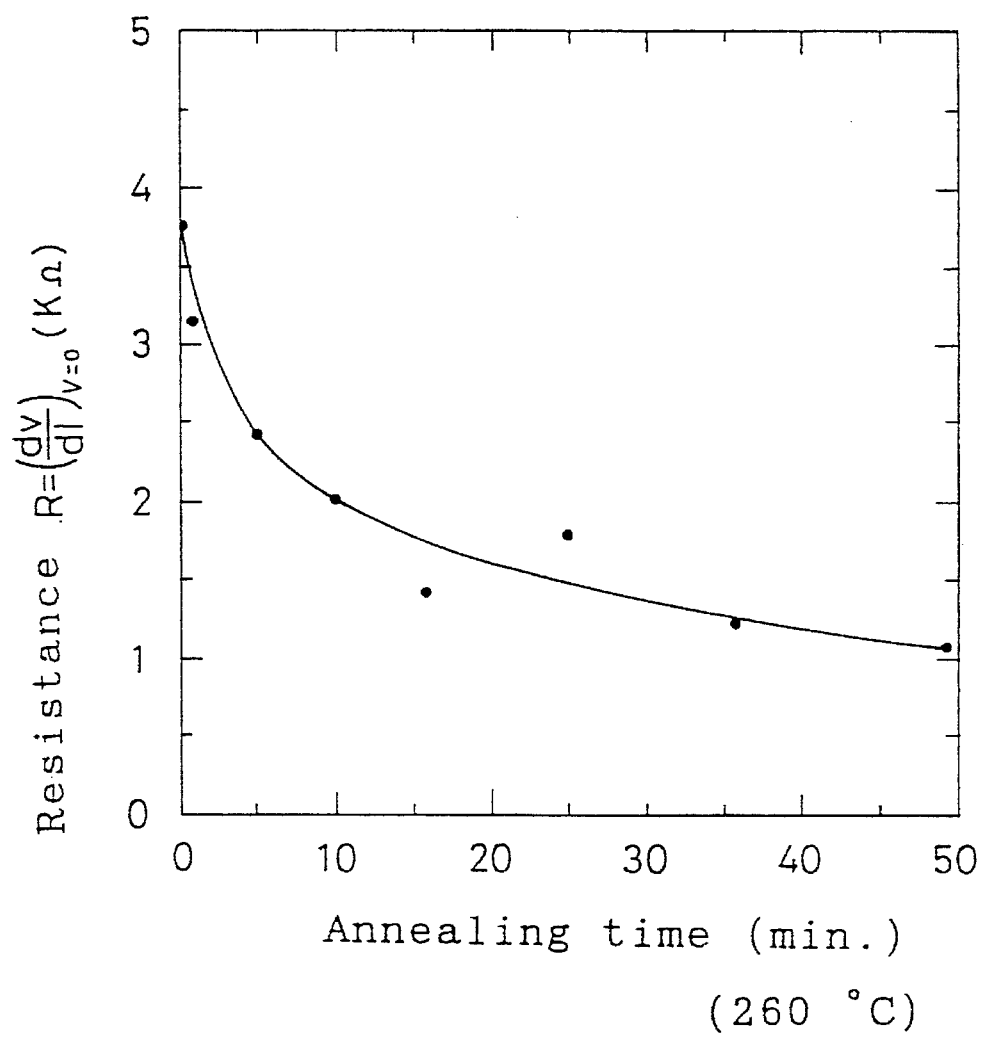
FIG. 5 shows an annealing time dependence of differential resistance value at 0 V of an Nb/p-ZnSe/p-GaAs structure of the present invention.

The annealing time dependence of the differential resistance value at 0 V of a sample with the same structure was measured. The result is shown in FIG. 5. Annealing temperature was 260° C. The differential resistance value decreased rapidly for 10 minutes after beginning, and decreased slowly after that. Not less than 10 minutes is preferable to make a sufficiently low resistance in a short while.

Table 1 shows the free energy change ΔG of nitride formation and melting points of several metals.

TABLE 1

| METALS | ΔG (KJ/mol) | MELTING POINTS (°C.) |
| --- | --- | --- |
| Mn | −24 | 1260 |
| Cr | −28 | 1800 |
| V | −103 | 1735 |
| Ta | −148 | 3000 |
| Nb | −207 | 2500 |
| Zr | −250 | 1750 |

In the metals shown above, as comparative examples, Mn and Cr, which are free energy change ΔG of nitride formation lower than −100 kJ/mol were used for the metal layer to make the same electrodes as the above in the same way and to measure the current-voltage characteristics between the two electrodes. The Mn and Cr did not provide good ohmic contacts.

Example 2

A II-VI group compound semiconductor device (laser) in accordance with the present invention is shown below. The laser device structure comprises, on an n-type GaAs substrate 1, an n-type ZnS$_{0.07}$Se$_{0.93}$ buffer layer 2 (0.1 μm of layer thickness, Nd−Na=$1\times10^{18}$ cm$^{-3}$), an n-type Zn$_{0.91}$Mg$_{0.09}$S$_{0.12}$Se$_{0.88}$ cladding layer 3, (1.0 μm of layer thickness, Nd−Na=$5\times10^{17}$ cm$^{-3}$), an n-type ZnS$_{0.07}$Se$_{0.93}$ optical waveguide layer 4 (0.1 μm of layer thickness, Nd−Na=$5\times10^{17}$ cm$^{-3}$), a Zn$_{0.8}$Cd$_{0.2}$Se active layer 5 (7.5 nm of layer thickness), a p-type ZnS$_{0.07}$Se$_{0.93}$ optical waveguide layer 6 (0.1 μm of layer thickness, Na−Nd=$5\times10^{17}$ cm$^{-3}$), a p-type Zn$_{0.91}$Mg$_{0.09}$S$_{0.12}$Se$_{0.88}$ cladding layer 7 (1.5 μm of layer thickness, Na−Nd=$5\times10^{17}$ cm$^{-3}$), a p-type ZnSe contact layer 8 (0.1 μm of layer thickness, Na−Nd=$2\times10^{18}$ cm$^{-3}$), a p-type electrode 9, an n-type electrode 11 and a polyimide buried layer 10. MBE method was used to form the above semiconductor layers, namely the buffer layer 2, cladding layer 3, optical waveguide layer 4, active layer 5, optical waveguide layer 6, cladding layer 7 and contact layer 8.

Figure 1:
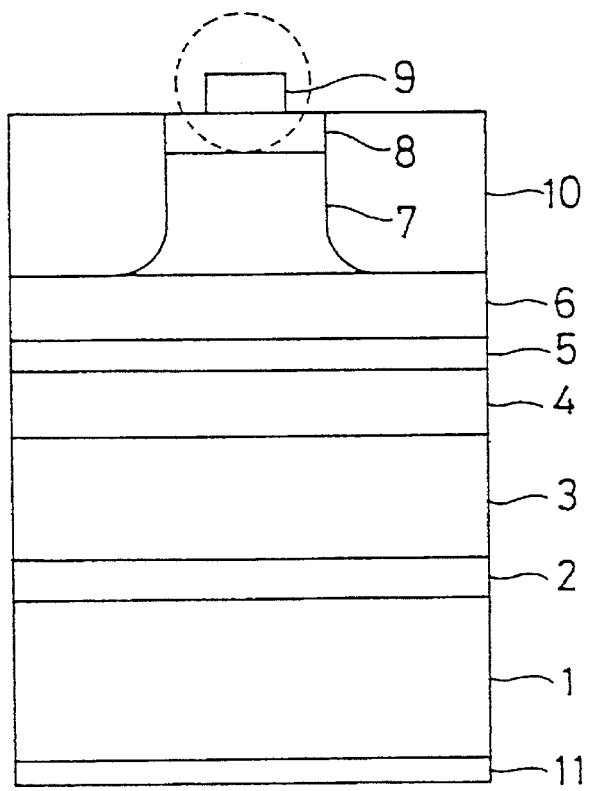
FIG. 1 is a schematic sectional view showing an embodiment of a II–VI group compound semiconductor device of the present invention.
Figure 2:
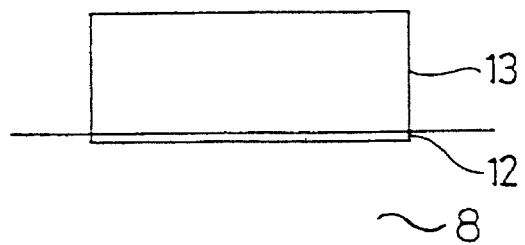
FIG. 2 is an enlarged view of a p-type electrode in the semiconductor device of FIG. 1.

The electrode part on the p-type side comprises an Nb layer 13 deposited on the p-type ZnSe contact layer 8 by electron beam evaporation at room temperature, and an NbN layer 12 formed by the reaction of the Nb layer 13 during the deposition and by annealing after the deposition (FIG. 2). The electron beam evaporation was carried out maintaining the substrate temperature at room temperature and at background pressure in the range of $3\times10^{-7}$–$5$–$10^{-7}$ Torr and at not more than $5\times10^{-6}$ Torr of vacuum during the deposition. The layer thickness of the Nb layer 13 was 50 nm. Before forming the Nb layer 13, the surface of the p-type ZnSe contact layer 8 was cleaned by ultrasonic treatment for 5 minutes in acetone and 2 minutes in ethanol, and etched for 3 minutes with saturated bromine water (SBW): hydrobromic acid (HBr): water (H$_2$O)=1:10:90 as an etchant at room temperature. By the etching, the surface of the p-type ZnSe contact layer was etched at approximately 30 nm, and the oxides and carbides on the surface were removed. After forming the Nb layer 13, the device was annealed by electric furnace at 260° C. for 7 minutes in the atmosphere of nitrogen: hydrogen=95:5. In order to prevent the deterioration of device properties, annealing at not more than 300° C. is preferable. Then the structure in FIG. 1 was completed by forming the n-type side electrode 11 and polyimide buried layer 10. The Nb electrode obtained in this way was more excellent in adhesion than an electrode formed by Au instead of Nb in the same structure.

Example 3

Figure 6:
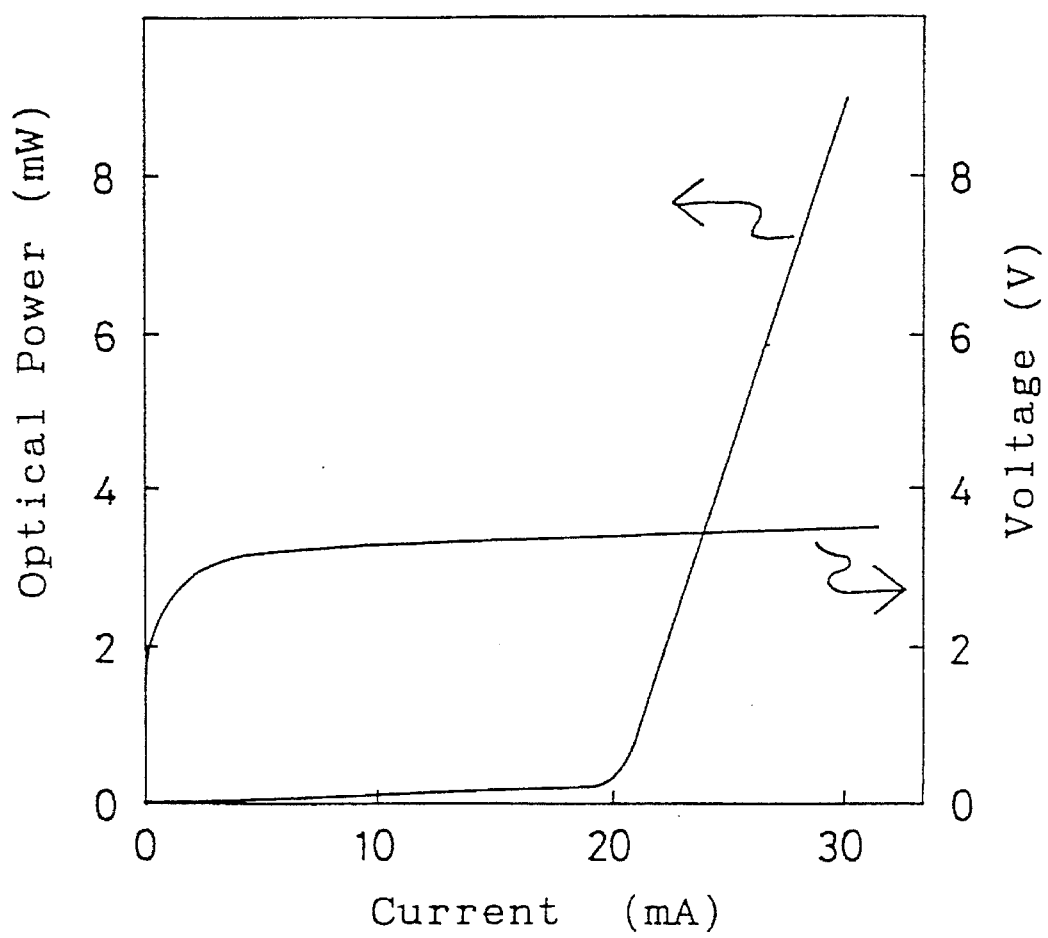
FIG. 6 shows current-optical output power characteristics and current-voltage characteristics of a laser device as an embodiment of the present invention.

A laser device with 1 mm cavity length was made of the laser structure in FIG. 1 (stripe width: 5 μm) by cleavage. The laser device was set on a copper heat sink with a junction-up configuration, and the current-optical output characteristics and current-voltage characteristics of the device by CW operation were measured at room temperature. The end of the laser device cavity had no coating and kept cleaved, FIG. 6 shows the cuurent-optical output characteristics and current-voltage characteristics of the laser device. As shown in FIG. 6, 20 mA of threshold current and 3.4 V of threshold level voltage were obtained.

On the other hand, when the p-type electrode 9 was formed of an Au electrode, the voltage was not less than 10 V, and when the p-type side electrode 9 was formed of a Au/ZnTe/ZnSe-ZnTe electrode structure by Fan et al. ("Continuous-wave, room temperature, ridge waveguide green-blue diode laser", A. Salokatve et al., Electronics Lett. Vol. 29 p.2192), it was 4.4 V.

Example 4

A nitrogen-doped p-type ZnSe, $ZnS_{0.2}Se_{0.8}$ (Na–Nd=2× $10^{17}$ cm$^{-3}$), $Zn_{0.91}Mg_{0.09}S_{0.12}Se_{0.78}$ (Na–Nd=5×$10^{17}$ cm$^{-3}$), $Zn_{0.91}Mg_{0.09}Se$ (Na–Nd=5×$10^{17}$ cm$^{-3}$) which were formed on a semi-insulated GaAs substrate by MBE method with nitrogen radical doping and the surface of the above four p-type layers were cleaned in the same way as in Example 1.

Next, the semi-insulated GaAs substrate on which the above four layers were formed respectively by resistive heat evaporation, were kept at room temperature, 50 nm of Zr layer was deposited by electron beam evaporation on the above four layers to form an electrode, respectively.

Example 5

AES characterization of ZnSe surfaces

In order to understand the effect of SBW etching, ZnSe surfaces of a polycrystalline substrate and an epitaxial layer grown by MBE method were analyzed by Auger electron spectroscopy (AES).

FIG. 11 represents AES in-depth profiles taken from an undoped ZnSe epitaxial layer cleaned by acetone solution. Carbon and oxygen are clearly observed within about 2 nm thickness from the surface of the layer. The AES analysis reveals that there exists a thin dielectric layer composed of oxygen and carbon on the ZnSe surface.

FIG. 12 is X-ray photoemission spectra of Se 3d electrons for ZnSe epitaxial layers cleaned by acetone solution (described simply as acetone surface) and SBW etching for 3 minutes (described as SBW surface). A weak Se 3d peak corresponding to the Se—O bond with a binding energy of 62 eV is observed on the acetone surface in FIG. 12, which gives the evidence of the existence of selenium oxide (which may be presumably $SeO_2$). A strong Se 3d peak corresponding to the ZnSe bond in FIG. 12 is constructed form multiple peaks of Se $3d_{3/2}$ with a binding energy of 56.9 eV and Se $3d_{5/2}$ with 56.2. ev. A broad peak in the lower energy side at 48 eV is due to the spin-orbit interaction between 3d electrons. It should be noted that the Se 3d peak related with the selenium oxide disappears on the SBW surface, indicating the removal of selenium oxide.

The present invention provides a blue light-emitting device with lower operating voltage than the devices using conventional electrode structures.

What we claim is:

1. A II-VI group compound semiconductor device having a p-type $Zn_xMg_{1-x}S_ySe_{1-y}$ ($0 \leq x \leq 1$, $0 \leq y \leq 1$) semiconductor layer, on which an electrode layer is formed with at least metallic nitride layer lying between the semiconductor layer and the electrode.

2. A II-VI group compound semiconductor device as set forth in claim 1, wherein the metallic nitride layer is formed of NbN, VN, WN, TaN, MoN, HfN, ZrN, ScN, TiN, CrN, WTiN, WSiN, NbVN, NbHFN, ScVN or CrTaN.

3. A II-VI group compound semiconductor device as set forth in claim 1, wherein the p-type $Zn_xMg_{1-x}S_ySe_{1-y}$ ($0 \leq x \leq 1$, $0 \leq y \leq 1$) in the semiconductor layer is ZnS (x=1, y=1), MgS (x=0, y=1), ZnSe (x=1, y=0), MgSe (x=0, y=0), $ZnS_ySe_{1-y}$ (x=1, 0<y<1), $MgS_ySe_{1-y}$ (x=0, 0<y<1), $Zn_xMg_{1-x}S$ (0<x<1, y=1), $Zn_xMg_{1-x}Se$ (0<x<1, y=0), or $Zn_xMg_{1-x}S_ySe_{1-y}$ (0<x<1, 0<y<1).

4. A II-VI group compound semiconductor device as set forth in claim 1, wherein the p-type $Zn_xMg_{1-x}S_ySe_{1-y}$ ($0 \leq x \leq 1$, $0 \leq y \leq 1$) is ZnSe, $ZnS_{0.07}Se_{0.93}$ or ZnMgSSe lattice matched to GaAs.

5. A II-VI group compound semiconductor device as set forth in claim 1, wherein a thickness of the electrode layer is in a range of 10 to 10,000 nm.

6. A II-VI group compound semiconductor device as set forth in claim 1, wherein the at least metallic nitride layer is formed of Al, Pt, Mn, Cr, Nb, V, Ta, Zr, Mo, Hf, Zr or W.

* * * * *